US008330660B2

(12) United States Patent
Oh et al.

(10) Patent No.: US 8,330,660 B2
(45) Date of Patent: Dec. 11, 2012

(54) METHOD FOR TUNING GLASS ANTENNA

(75) Inventors: Jung Hoon Oh, Gyeonggi-do (KR); Yong Ho Noh, Gyeonggi-do (KR); Tae-Heon Kim, Seoul (KR); Ho-Sung Choo, Seoul (KR); Woo-Jun Kang, Seoul (KR)

(73) Assignee: Hyundai Motor Company, Seoul (KR)

( * ) Notice: Subject to any disclaimer, the term of this patent is extended or adjusted under 35 U.S.C. 154(b) by 794 days.

(21) Appl. No.: 12/499,177

(22) Filed: Jul. 8, 2009

(65) Prior Publication Data

US 2010/0033387 A1 Feb. 11, 2010

(30) Foreign Application Priority Data

Jul. 8, 2008 (KR) ........................ 10-2008-0066189
Feb. 4, 2009 (KR) ........................ 10-2009-0008931

(51) Int. Cl.

| | |
|---|---|
| ***G01R 29/10*** | (2006.01) |
| ***G01R 29/08*** | (2006.01) |
| ***H01Q 3/00*** | (2006.01) |
| ***H01Q 1/32*** | (2006.01) |

(52) U.S. Cl. ........ 343/703; 343/760; 343/894; 343/713; 343/715; 342/360

(58) Field of Classification Search ........................ None
See application file for complete search history.

(56) References Cited

FOREIGN PATENT DOCUMENTS

| | | | |
|---|---|---|---|
| JP | 2002-340954 A | | 11/2002 |
| JP | 2006-128883 A | | 5/2006 |
| JP | 2006-287873 A | | 10/2006 |
| JP | 2010-171967 A | | 8/2010 |
| KR | 2006-0013754 | | 2/2006 |
| KR | 10-2006-0100860 | | 9/2006 |
| KR | 10-2008-0006871 | | 1/2008 |

*Primary Examiner* — Jacob Y Choi
*Assistant Examiner* — Graham Smith
(74) *Attorney, Agent, or Firm* — Edwards Wildman Palmer LLP; Peter F. Corless

(57) ABSTRACT

The present invention relates to a method of tuning a glass antenna that is capable of analyzing the sensitivity of each point, and forming a structure of a glass antenna by making use of a common simulation tool so as to perform tuning depending on a priority that is determined by data obtained by analyzing the sensitivity.

15 Claims, 11 Drawing Sheets

METHOD FOR TUNING GLASS ANTENNA

CROSS-REFERENCE TO RELATED APPLICATION

This application claims under 35 U.S.C. §119(a) the benefit of Korean Patent Application Nos. 10-2008-0066189 and 10-2009-0008931, filed on Jul. 8, 2008 and Feb. 4, 2009, respectively, the entire contents of which are incorporated herein by reference.

BACKGROUND OF THE INVENTION

The present invention relates to a method of tuning a glass antenna, more particularly, in preferred embodiments the present invention relates to a method of tuning a glass antenna by setting a priority according to a sensitivity of each point forming the structure of a glass antenna.

Typically, a vehicle is equipped with an audio/video system for a driver or a passenger to listen and watch a broadcast. The system is equipped with an antenna for receiving a wave transmitted from an external transmitting station. Examples of such antenna include a pole antenna which stands high from a car body, and a glass antenna which is printed on the glass surface of a vehicle, for example at the rear of the vehicle.

The glass antenna has been widely used in the past. Typically, the glass antenna is printed with a copper pattern on the rear glass surface of a vehicle taking into consideration the outer appearance of the vehicle and the durability thereof. In addition, the glass antenna acts as various types of antennas, such as FM, AM, and TV antennas.

For at least AM bands, however, controlling noise influx is hard and providing the glass antenna with a uniform quality is not easy. As a result, a backdoor glass of a vehicle is not always utilized.

Accordingly, in those cases where a vehicle has a backdoor glass, for example a sedan type or a RV type vehicle, a radio and TV antenna is installed by utilizing a quarter glass surface. However, due to the limit of size of quarter glass surface, there may be problems in antenna tuning. Further, as the design is not standardized, a new antenna needs to be designed for a new vehicle model, which may require cost and time.

Additionally, different types of glass antennas are required to receive different kinds of broadcast signals including AM radio, FM radio, TV, satellite/ground wave DMB, etc. according to the operation frequency and the frequency bandwidth of each broadcast.

In addition, when a gain of a designed antenna in a specific frequency is lower than a gain of other frequency in a frequency bandwidth, antenna tuning is necessary without changing the structure of the designed antenna.

Conventionally, antenna tuning is performed not by a systematized tuning method, but by a trial and error method. A glass antenna tuned in a frequency bandwidth by the trial and error method may show a decrease in the gain in the other frequency bandwidth. Further, the tuning efficiency of the trial and error method is not predictable.

The above information disclosed in this the Background section is only for enhancement of understanding of the background of the invention and therefore it may contain information that does not form the prior art that is already known in this country to a person of ordinary skill in the art.

SUMMARY OF THE INVENTION

In one aspect, the present invention preferably provides a method of tuning a glass antenna that is capable of improving work efficiency in the mounting tuning by obtaining an optimum direction and magnitude which can suitably enhance a gain through analyzing a change of gain in a specific frequency.

According to certain preferred embodiments, the invention provides a method for tuning a glass antenna, which includes analyzing a sensitivity of structures of a designed glass antenna using a simulation frame; determining a priority depending on the size of gains improved when the structures of the glass antenna are changed in each tuning frequency using analysis data of the sensitivity; selecting a specific frequency of the tuning frequencies; and performing a tuning according to the priority. Preferably, the tuning is stopped in a specific frequency when a gain value in the other frequency than the specific frequency is lower than a specific gain reference value, which is suitably a basic gain value for performing an antenna function.

In accordance with preferred embodiments of the present invention, the specific frequency is selected according to an order smaller than a suitable desired gain reference value or a specific suitable gain reference value which preferably is a basic gain value for performing an antenna function.

In accordance with the present invention, the sensitivity is preferably a gain change that is suitably obtained by using a simulation program.

In accordance with preferred aspects of the present invention, the structure of a glass antenna has contact points in which two or more lines intersect, and the contact points are suitably moved in the right and the left, and to the upper side and the lower side to perform the tuning.

In accordance with the present invention, the structure of glass antenna has lines, and lengths of the lines are suitably enlarged or reduced for change.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The above features and advantages of the present invention will be apparent from or are set forth in more detail in the accompanying drawings, which are incorporated in and form a part of this specification, and the following Detailed Description, which together serve to explain by way of example the principles of the present invention.

BRIEF DESCRIPTION OF THE DRAWINGS

The above and other features of the present invention will now be described in detail with reference to certain exemplary embodiments thereof illustrated by the accompanying drawings which are given hereinafter by way of illustration only, and thus are not limitative of the present invention, and wherein.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

DETAILED DESCRIPTION OF THE EMBODIMENTS

In one aspect, the present invention is directed to a method for tuning a glass antenna, the method comprising analyzing a sensitivity of structures of a designed glass antenna, determining a priority depending on size of gains improved when the structures of the glass antenna are changed in each tuning frequency using analysis data of the sensitivity, selecting a specific frequency of the tuning frequencies, and performing a tuning according to the priority, In one embodiment, analyzing the sensitivity is carried out using a simulation tool.

In another embodiment, the tuning is stopped in the specific frequency when a gain value in other frequency is lowered than a specific gain reference value which is a basic gain value for performing an antenna function.

In still another embodiment, the specific frequency is selected according to the order in which gain values of the specific frequencies are smaller than a desired gain reference value or specific gain reference value.

In yet another preferred embodiment, the sensitivity is a gain change obtained by using a simulation program.

In one preferred embodiment of the invention, the structure of the glass antenna has contact points in which two or more lines intersect.

In still another embodiment, the contact points are moved in a right, left, upper or lower direction to perform the tuning.

In another embodiment, the structure of glass antenna has lines.

In another related embodiment, the lengths of the lines are enlarged or reduced for change.

Exemplary embodiments of the present invention are described with reference to the accompanying drawings in detail. The same reference numbers are used throughout the drawings to refer to the same or like parts. Detailed descriptions of well-known functions and structures incorporated herein may be omitted to avoid obscuring the subject matter of the present invention In preferred aspects, the present invention discloses a method of tuning a glass antenna that comprises setting a tuning basis according to structures of the glass antenna, setting a basic direction of a spot tuning depending on a sensitivity of each tuning basis in the whole operating frequency band using a common simulation tool, and analyzing a change of gain values in a specific frequency to set the optimum tuning basis for suitably improving gain values and to draw a movement degree of the tuning basis, thereby maximizing the operating efficiency in the spot tuning.

Figure 1:
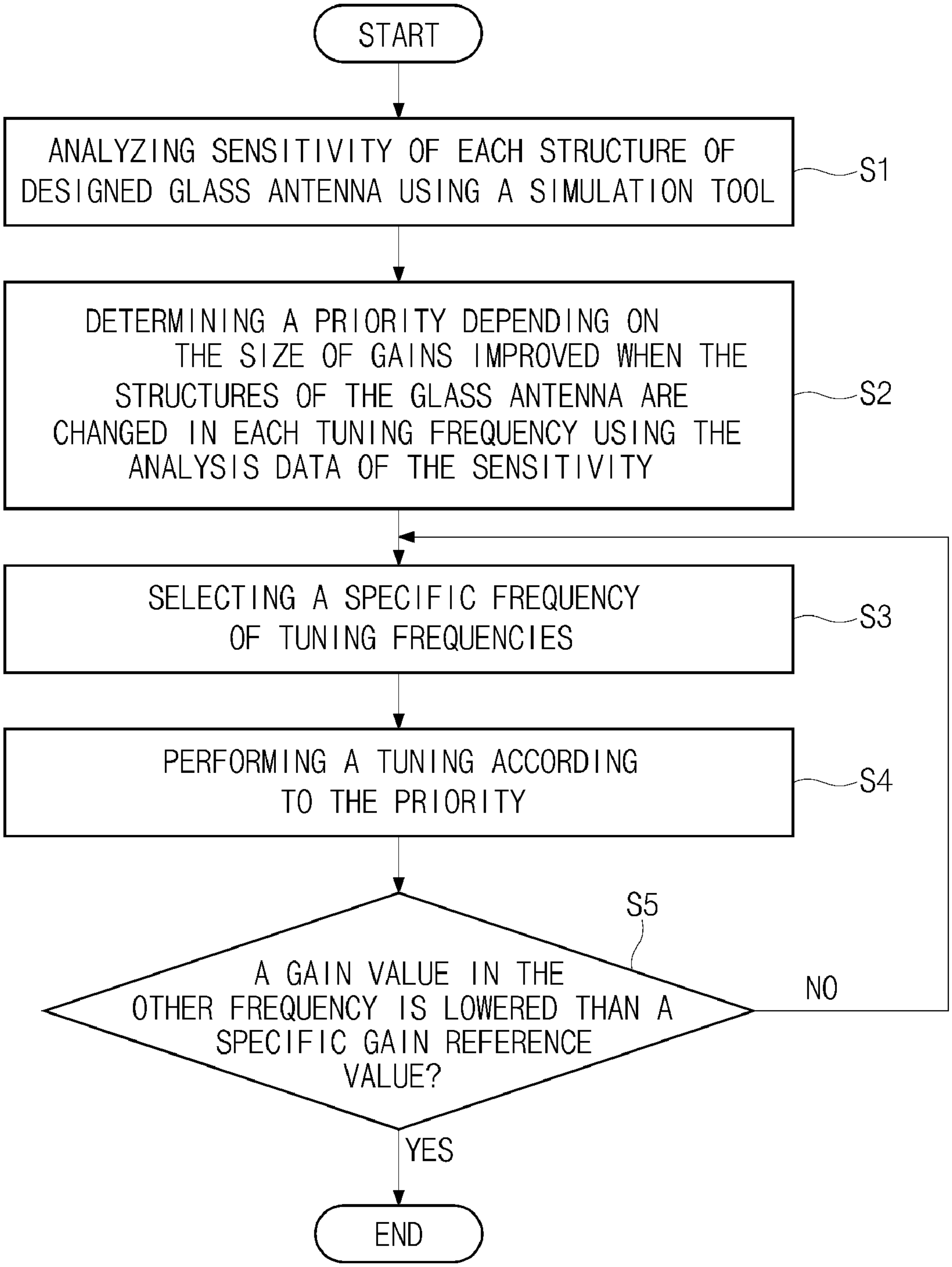
FIG. 1 is a flow chart showing a method of tuning a glass antenna according to the present invention.

FIG. 1 is a flow chart showing an exemplary method of tuning a glass antenna according to preferred embodiments of the present invention.

According to certain preferred embodiments of the present invention, the method of tuning a glass antenna comprises: analyzing a sensitivity of structures of a designed glass antenna using a simulation tool (S1); determining a priority depending on the size of gains improved when the structures of the glass antenna are changed in each tuning frequency using the analysis data of the sensitivity (S2); selecting a specific frequency of tuning frequencies (S3); performing a tuning according to the priority (S4); and stopping the tuning in the specific frequency when a gain value in the other frequency is suitably lowered than a specific gain reference value which is a basic gain value for preferably performing a glass antenna function (S5).

According to preferred embodiments, the specific frequency is selected according to the order in which gain values in the specific frequencies are suitably smaller than a desired gain reference value or a specific gain reference value which is a basic gain value for suitably performing an antenna function. The sensitivity is a gain change amount obtained by a simulation program.

Figure 2:
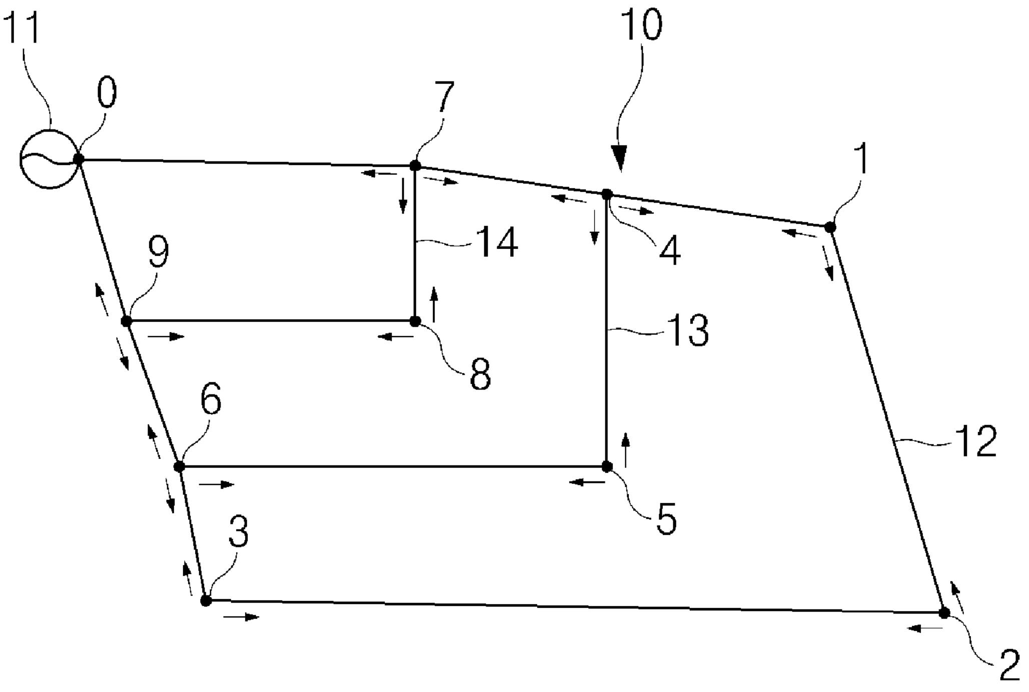
FIG. 2 is a diagram showing a method of tuning a glass antenna using a multi loop according to the present invention.

FIG. 2 is a diagram showing a glass antenna according to further preferred embodiments of the invention that uses a multi loop, and which is an example of a FM band glass antenna for preferably applying a method of tuning a glass antenna according to the present invention.

Referring, for example, to FIG. 2, the glass antenna 10 using a multi loop is suitably equipped on the quarter glass surface of for example, but not limited to, a RV, SUV or CUV type vehicle, while a plurality of small sized loops 13, 14 are suitably inserted into a big loop 12 which is arranged as a conductive device. In addition, according to further preferred embodiments, in the glass antenna using a multi loop, a part of line 12, 13, 14 of loops which are arranged with a polygonal structure or with a circular structure is suitably overlapped so as to facilitate a multi resonance and an optimum of antenna. Preferably, the glass antenna 10 using a multi loop includes a feeding point 11 in the upper portion of the left of an outer ring of the big loop 12, which is suitably connected to the big loop 12 by using an additional feeder.

In other further embodiments, based on the contact point 0 of the feeder and the big loop 12, each contact point is preferably numbered from the biggest loop 12 to the smallest loop 14. Accordingly, the number of contact point 0~9 is a sign for suitably classifying the contact point and able to be set arbitrary.

Figure 3:
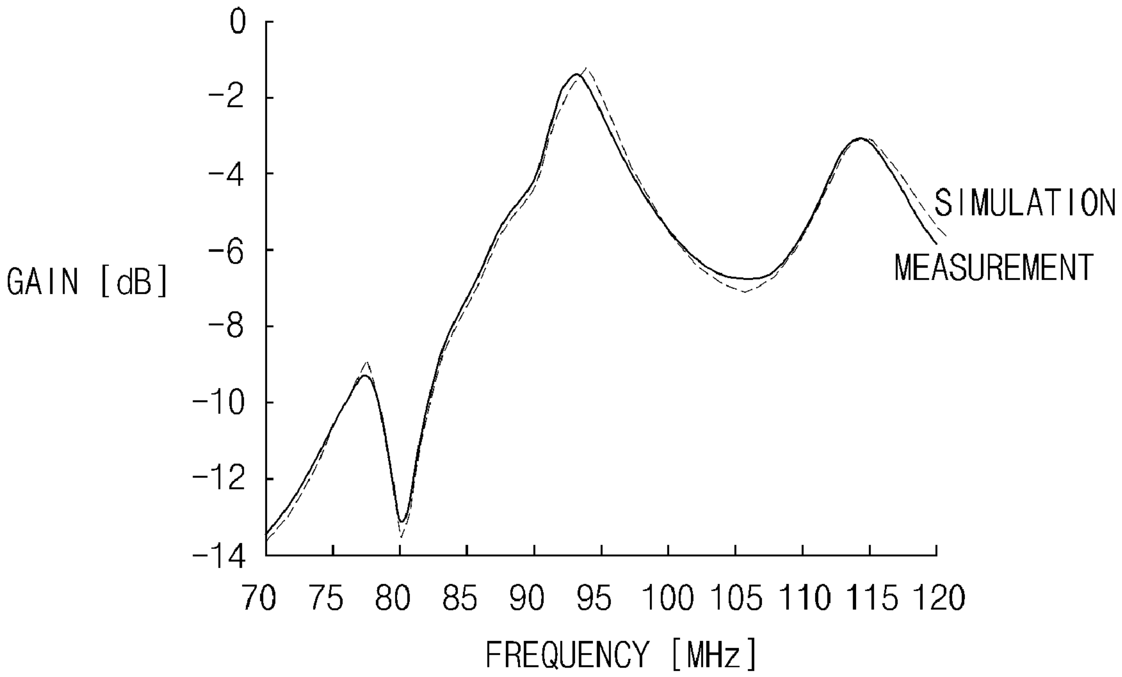
FIG. 3 is a graph showing a gain of the glass antenna of FIG. 2.

FIG. 3 is a graph showing an exemplary gain of the glass antenna 10 using a multi loop shown in FIG. 2.

In other exemplary embodiments, referring for example to FIG. 3, in the designed glass antenna, as there exists little accidental error between the gain obtained by the simulation through using the FEKO program which is a common simulation tool and the gain obtained by measuring the real manufactured glass antenna, the sensitivity of the glass antenna 10 in each structure is preferably analyzed by using the gain by the simulation.

Figure 4:
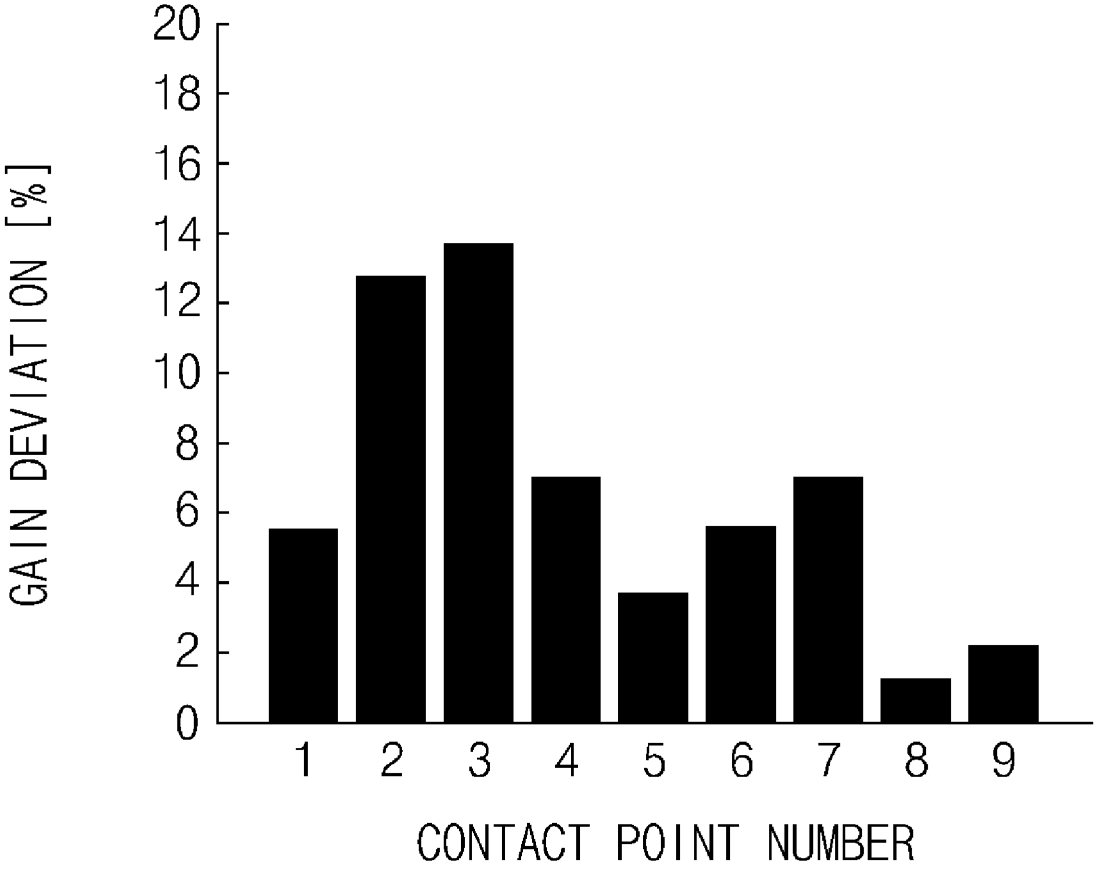
FIG. 4 is a graph showing a gain deviation of each contact point of the glass antenna of FIG. 2.

FIG. 4 is a graph showing a vertical gain deviation of each contact point 1~9 of the glass antenna 10 using a multi loop as shown in FIG. 2.

According to preferred embodiments of the invention as described herein, the sensitivity by each contact point 1~9 can be suitably defined by obtaining and averaging the gain change rate which is generated when each contact point 1~9 moves up and down, and from side to side. For example, in certain preferred embodiments, while a first contact point 1 moves by 0.5 cm, 1.0 cm, 1.5 cm and 2.0 cm along a line toward a second contact point 2 and a fourth contact point 4, the gain change rate of the whole frequency band is suitably obtained and averaged to define the sensitivity of the first contact point 1.

According to preferred embodiments of the invention, the Equation 1 represents the gain change rate of each contact point 1~9.

$$\text{Gain Change Rate} = \frac{\sum_{0.5\,cm}^{2\,cm} |(Gain_{tunned} - Gain_{original}|}{Gain_{original}} \times 100(\%) \quad \text{(Equation 1)}$$

In further embodiments, referring to FIG. 4, the contact point 3 having the largest sensitivity preferably indicates that the change of the gain is largest on the average in the whole frequency bandwidth. Accordingly, in preferred embodiments of the invention it is able to indicate other distribution result depending on a specific preferred frequency. Accordingly, in order to suitably improve a gain in a specific frequency, it is preferably necessary to identify how much the gain increases by movement toward a movable direction in each contact point.

Figure 5:
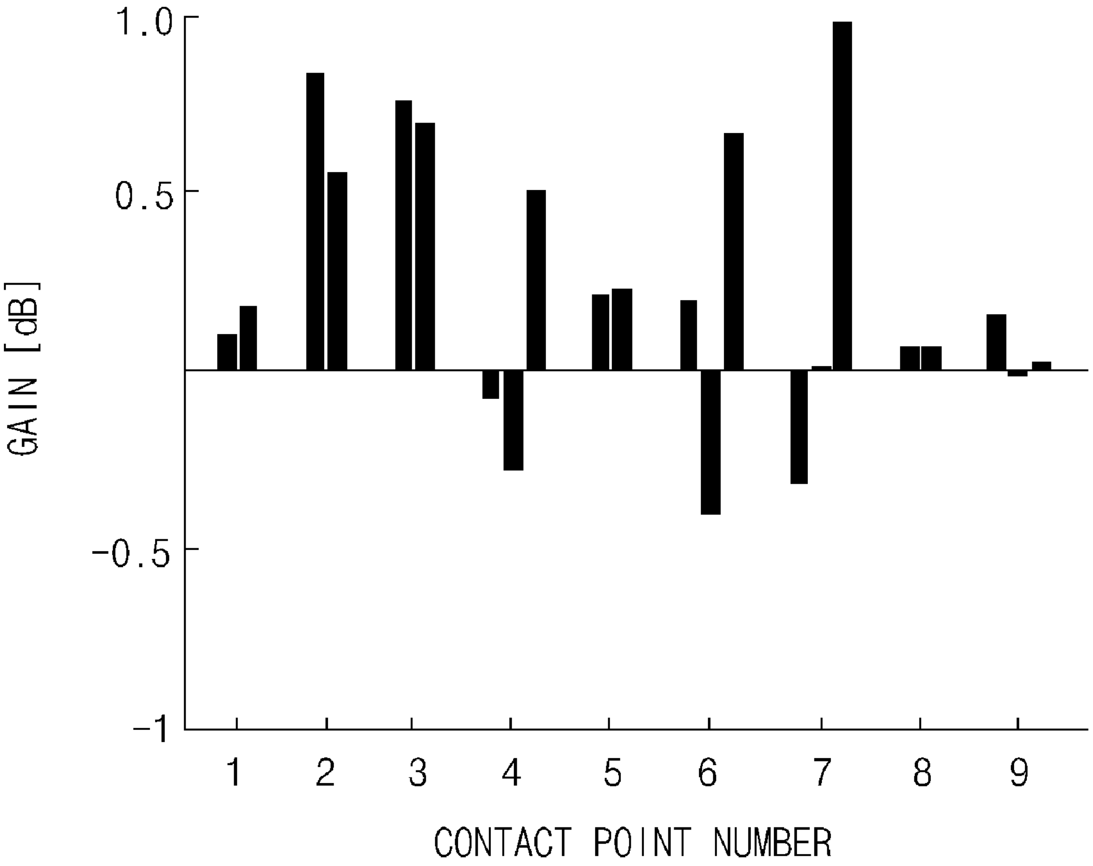
FIG. 5 is a graph showing a gain in a specific frequency (98 MHz) when each contact point of the glass antenna of FIG. 2 moves into a movable direction by 1 cm.

FIG. 5 is a graph showing a suitable gain of each contact point 1~9 in a specific frequency (98 MHz) when each contact point of the glass antenna 10 using a multi loop shown in FIG. 2 preferably moves into a movable direction by 1 cm.

Since the glass antenna 10 shown in FIG. 2 is an antenna in a FM frequency bandwidth, the graph shown in FIG. 5 preferably indicates the result of the gain change which is suitably obtained by using a simulation program in a specific frequency (98 MZ) for tuning among a FM frequency bandwidth, while the FM frequency bandwidth ranging from 73 MHz to 118 MHz is preferably divided into 10 sections by 5 MHZ.

According to further preferred embodiments, and referring to FIG. 5, it can be understood that the gain is most largely improved when the seventh contact point 7 is preferably moved into the lower side (the seventh contact point 8 directions) in a specific frequency (98 MZ) by 1 cm. Accordingly, by using such result, the tuning priority in a specific frequency (98 MZ) can be set depending on the size of improved gains as shown, for example, in [Table 1].

TABLE 1

| priority | Improvement direction | Improved quantity |
|---|---|---|
| 1 | seventh contact point 7 is moved into the lower side | 0.9704 dB |
| 2 | second contact point 2 is moved into the lower side | 0.8259 dB |
| 3 | third contact point 3 is moved into the right | 0.7535 dB |
| 4 | third contact point 3 is moved into the upper side | 0.6876 dB |
| 5 | sixth contact point 6 is moved into the lower side | 0.6571 dB |

It is thus exemplified that the priority of five high ranks is set so as to perform five times tuning, but it is limited as such, and the number of priority can be suitably changed according to the number of tuning.

Figure 6:
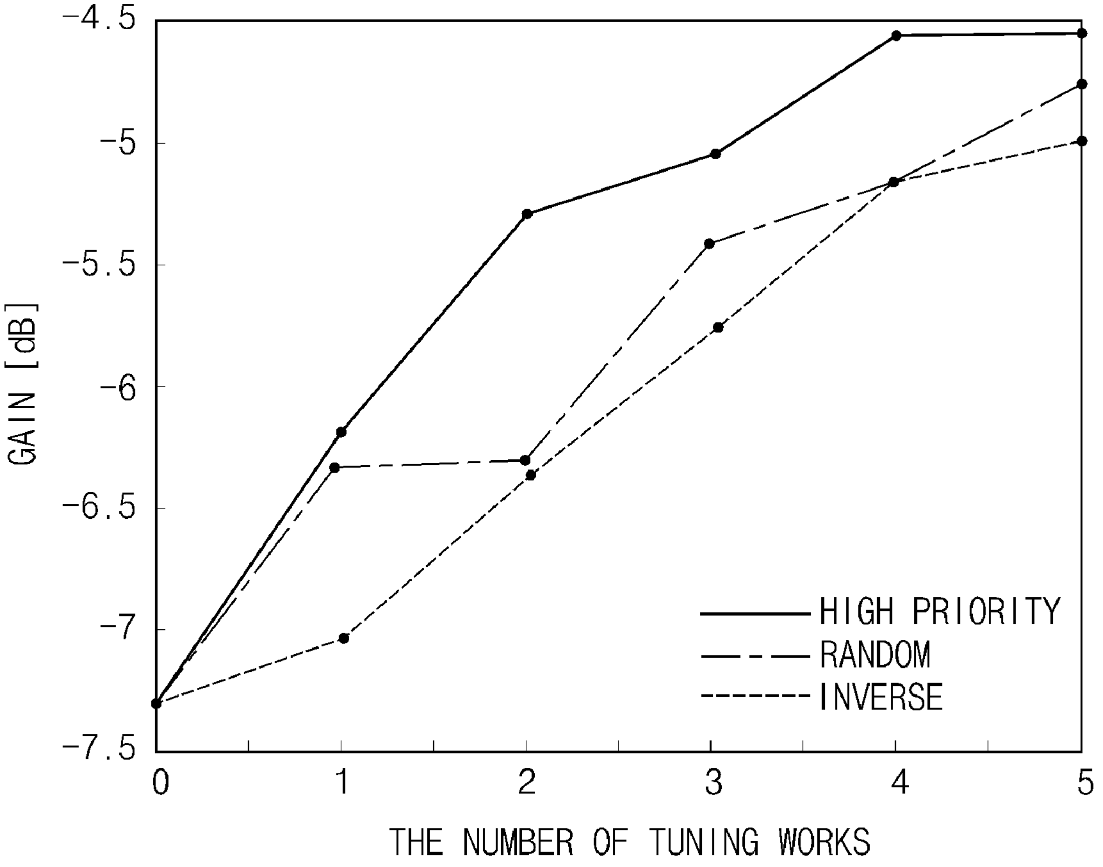
FIG. 6 is a graph showing a gain with respect to mounting tuning according to a priority as shown in [Table 1] (High priority), mounting tuning in reverse order (Inverse), and mounting tuning in random order (Random).

FIG. 6 is a graph showing the exemplary change of gains in an exemplary case of performing the mounting tuning according to a priority of [Table 1] (high priority) in the specific frequency (98 MHz), in an exemplary case of performing the mounting tuning in reverse order (Inverse), and in an exemplary case of performing the mounting tuning in random order (Random), and thus showing that the increasing rate of gain is highest when the mounting tuning is suitably performed according to a priority.

Figure 7:
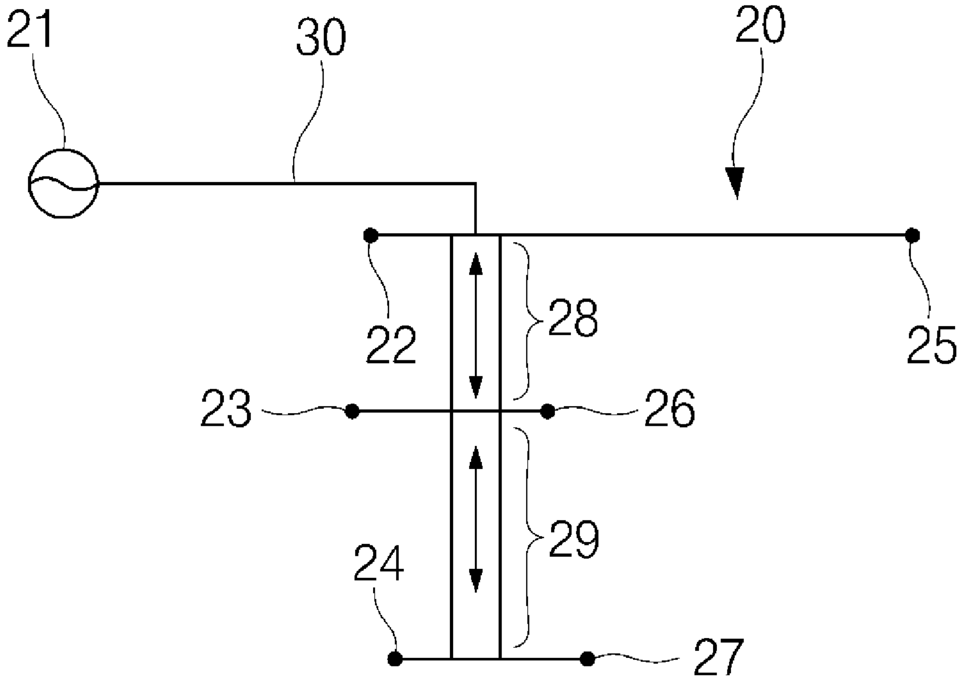
FIG. 7 is a diagram showing a method of tuning a glass antenna according to the present invention in which the glass antenna is loaded with a multi line.

FIG. 7 is a diagram showing an exemplary glass antenna loaded with a multi line which is an example of a T-DMB (ground wave DMB) band glass antenna for suitably applying a method of tuning a glass antenna according to certain preferred embodiments of the present invention.

Preferably, the glass antenna 20 where a multi line is loaded is suitably arranged in such a manner that a plurality of branch lines 22~27 are preferably loaded in two vertical lines 28 and 29 of a conductive element. Although the vertical lines 28 and 29 are a double line in this embodiment of the present invention, multiple lines may be used where a single line or a plurality of vertical lines are preferably arranged in parallel. Also, in other further embodiments, although the structure where six branch lines 22-25, 23-26, 24-27 are loaded in the vertical lines 28 and 29 is exemplified, the number of branch lines may be suitably increased if necessary.

In other further embodiments, for example in the case of tuning the glass antenna 20 where a multi line is loaded, two or three lines should preferably be moved simultaneously. Accordingly, when the tuning is preferably performed by the conventional trial and error method, the tuning work becomes suitably complicated. However, in according to certain preferred embodiments of the invention as described herein, the efficiency of the work can be maximized. That is, preferably, the glass antenna for T-DMB has a suitably simple structure, and in the example of performing the tuning in the actual spot, the method is simple and the working time is suitably small.

Additionally, according to further embodiments of the invention as defined herein, the tuning standard is set in such a manner that the work in the actual spot is suitably facilitated. For instance, in certain preferred embodiments, eight lines except the feeder 30 which connects the feeding point 21 to the center line among nine lines forming the structure of antenna is preferably set as a tuning point. Accordingly, eight lines include the vertical lines 28 and 29 connected up and down based on the branch lines 23, 26, and branch lines 22~27 loaded in both sides based on the vertical lines 28 and 29.

Figure 8:
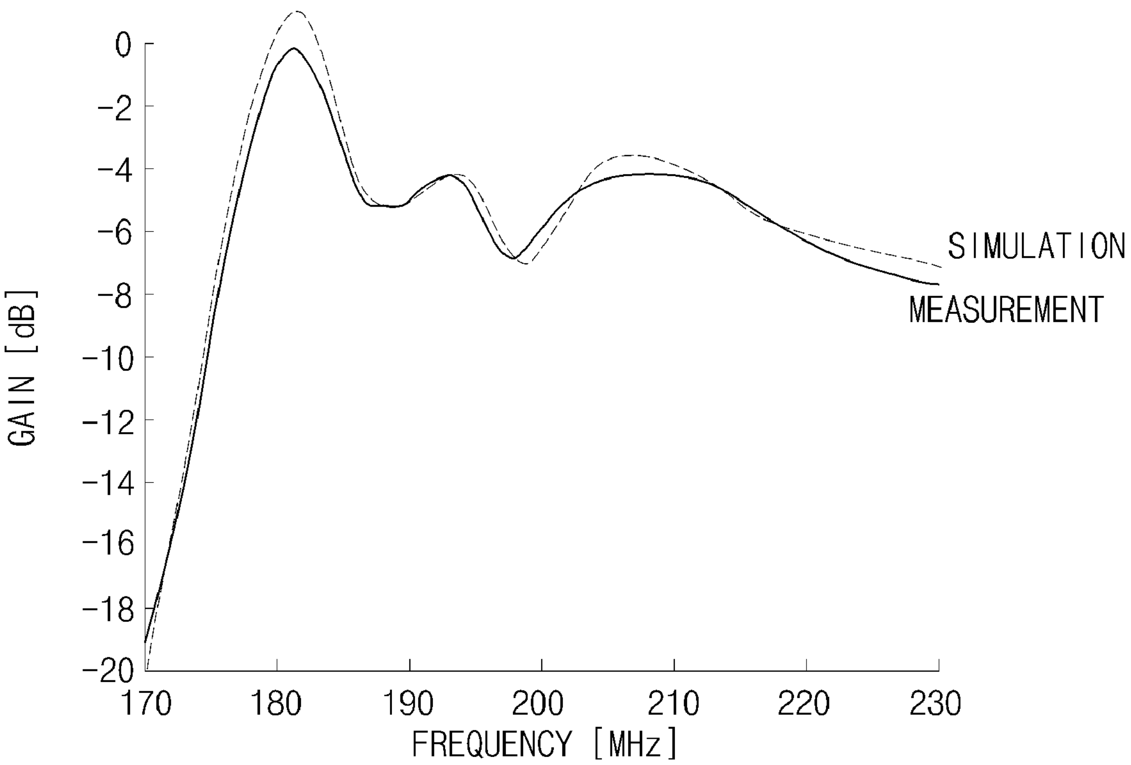
FIG. 8 is a graph showing a gain of the glass antenna of FIG. 7.

FIG. 8 is a graph showing a gain of the glass antenna 20 being loaded with a multi line shown in FIG. 7.

In other further embodiments, and referring for example to FIG. 8, since there exists little difference between the gain obtained by simulating the designed glass antenna 20 through using the FEKO program which is a common simulation tool and the gain obtained by measuring the real manufactured glass antenna, the sensitivity according to the length of each line 22~29 of the glass antenna 20 is preferably analyzed through using the gain by the simulation.

Figure 9:
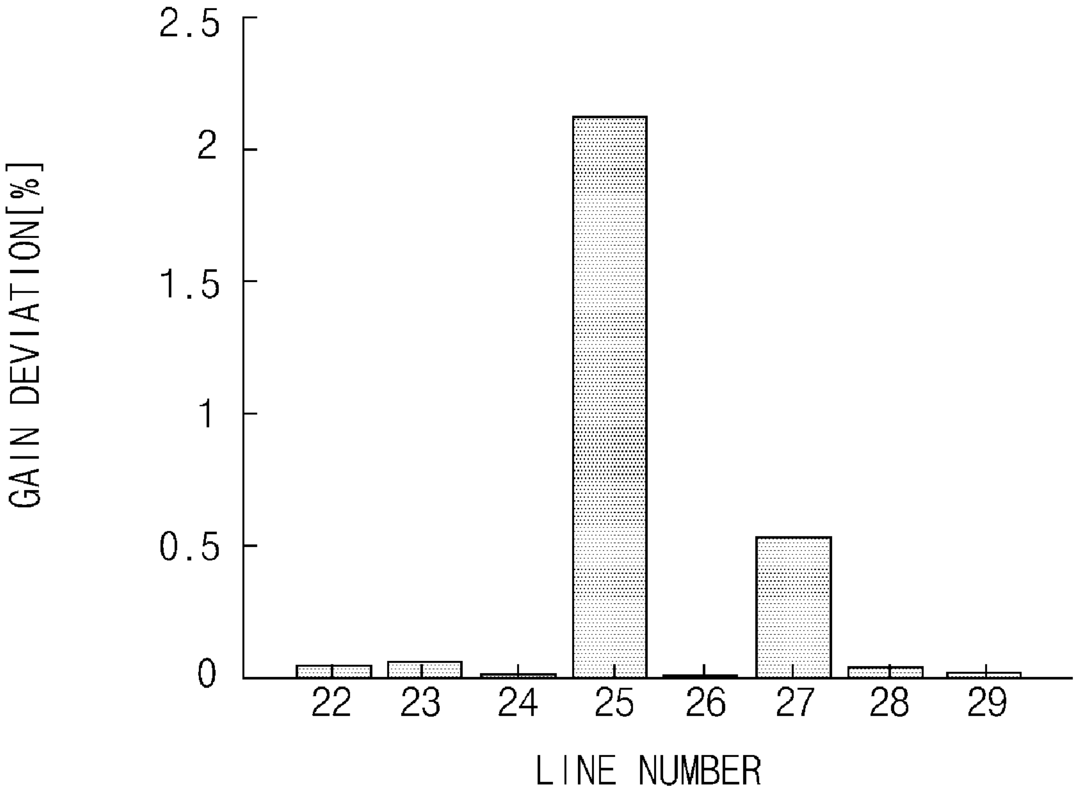
FIG. 9 is a graph showing a gain deviation according to the length of each line 22~29 of the glass antenna of FIG. 7.

FIG. 9 is a graph showing the sensitivity of the vertical gain deviation according to the length of each line 22~29 of the glass antenna 20 preferably being loaded with a multi line shown in FIG. 7.

According to further preferred embodiments of the invention, the sensitivity by each line 22~29 can be defined by obtaining and averaging the gain change rate which is suitably generated when each line 22~29 moves up and down, and from side to side. For example, in certain embodiments, while the first line 22 may be suitably enlarged or suitably reduced in a right or left direction, by 0.5 cm, 1.0 cm, 1.5 cm and 2.0 cm, the gain change rate of the whole frequency band is preferably obtained through Equation 1 and averaged to define the sensitivity of the first branch line 22.

Meanwhile, according to further preferred embodiments of the present invention, the fourth branch line 25 having the largest sensitivity preferably indicates that the change of the gain is largest on the average in the whole frequency bandwidth. Accordingly, it is able to indicate other distribution result depending on a specific preferred frequency. That is, according to particular preferred embodiments, in order to improve a gain in a specific frequency, it is necessary to identify how much the gain increases by movement toward a movable direction in each contact point.

Figure 10:
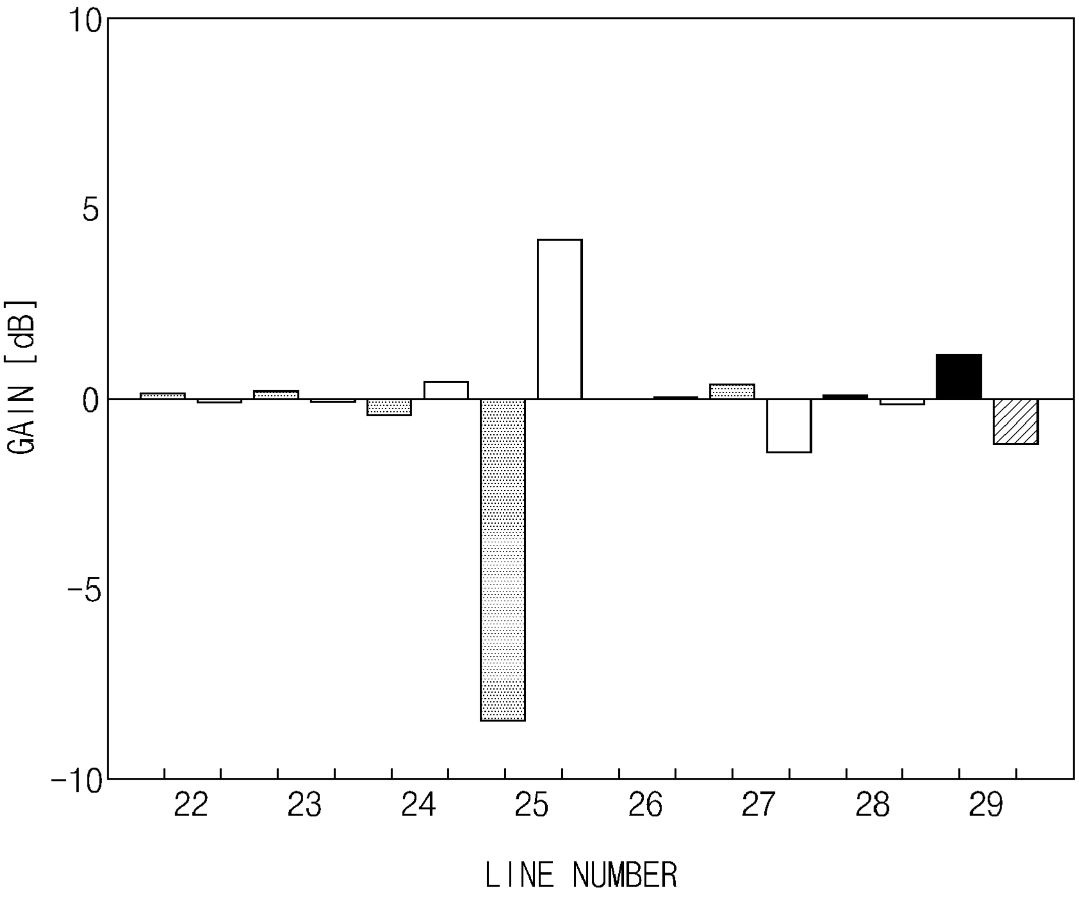
FIG. 10 is a graph showing a gain in a specific frequency (98 MHz) when the length of each line 22~29 of the glass antenna of FIG. 7 extends or retrenches in a movable direction by 1 cm.

In certain preferred embodiments of the invention and as shown in FIG. 10, FIG. 10 is a graph showing a gain in a specific frequency (98 MHz) when the length of each line 22~29 of the glass antenna 20 being loaded with a multi line shown in FIG. 7 extends or shortens in a movable direction by 1 cm. Preferably, the vertical lines 28 and 29 of the glass antenna 20 are suitably extended or shortened into up and down, while the first to the sixth branch lines 22~27 are suitably extended right and left, by 1 cm respectively, thereby obtaining a gain. Further, since the glass antenna 20 shown in FIG. 7 is preferably an antenna of the T-DMB frequency bandwidth, a section from 171 to 230 MHz is suitably divided into sections by 6 MHz unit, and the graph shown in FIG. 10 indicates the result of gains obtained by the simulation program in a specific frequency 207 MHz for tuning among the sections.

Thus, according to further preferred embodiments and referring to FIG. 10, it can be understood that the gain is most largely enhanced when the fourth branch line 25 is suitably extended into the right by 1 cm. Preferably, by using such result, the tuning priority in a specific frequency 207 MHz can be set, for example, as shown in [Table 2].

TABLE 2

| priority | Improvement direction | Improved quantity |
|---|---|---|
| 1 | fourth branch line 25 is extended in the right | 0.23 dB |
| 2 | second center line 29 is extended in the upper side | 0.21 dB |
| 3 | third branch line 24 is shortened in the right | 0.085 dB |
| 4 | sixth branch line 27 is shortened in the left | 0.067 dB |
| 5 | first branch line 22 is shortened in the left | 0.047 dB |

As shown in Table 2, it is exemplified that the priority of five high ranks is preferably set so as to perform five times tuning, but it is not intended to be limited as such, and the number of priority can be suitably changed according to the number of tuning.

Figure 11:
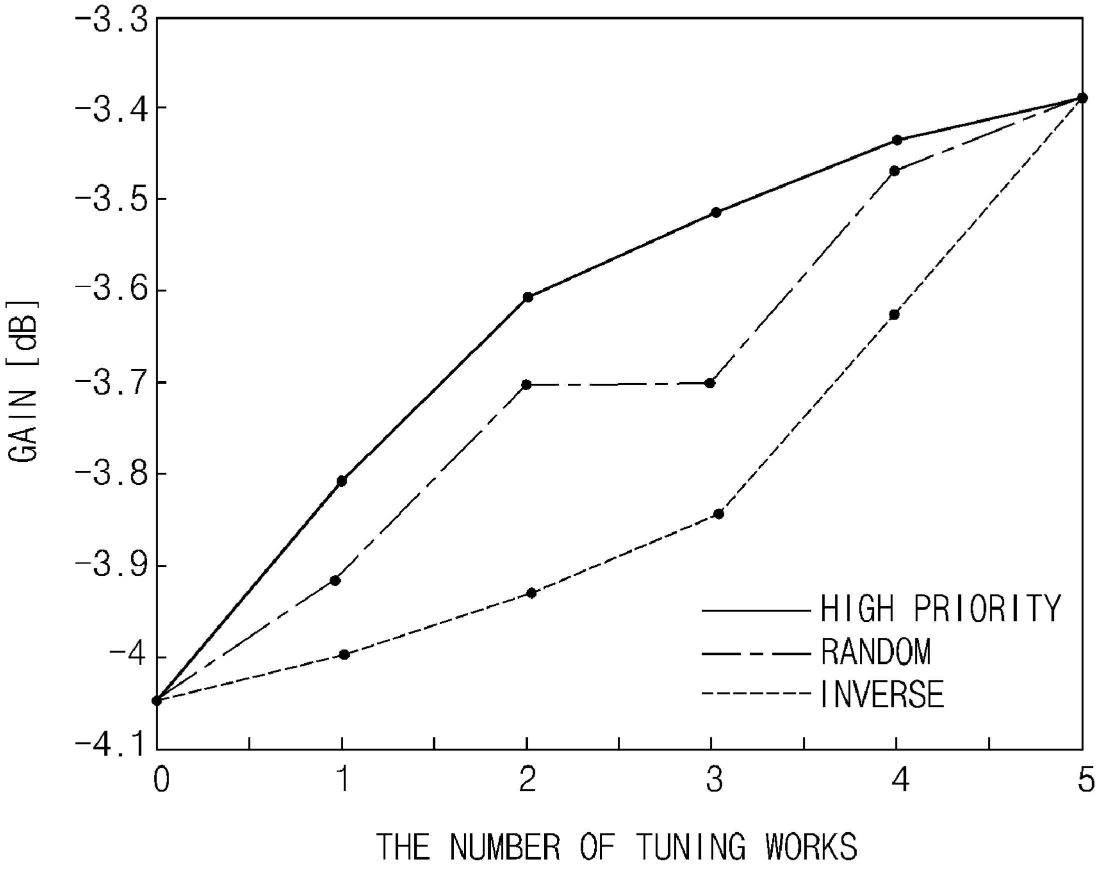
FIG. 11 is a graph showing a gain with respect to mounting tuning according a priority of [Table 2] (High priority), mounting tuning in reverse order (Inverse), and mounting tuning in random order (Random).

According to other further embodiments, and as shown in FIG. 11, FIG. 11 is a graph showing the change of gains in case of performing the mounting tuning according to certain preferred priority, for example as shown in [Table 2] (High priority), in the example of performing the mounting tuning in reverse order (Inverse), and in the example of performing the mounting tuning in random order (Random), showing that gain increase rate is highest according to the number of the tuning works when the mounting tuning is suitably performed according to a priority.

According to preferred embodiments of the present invention as described herein, when the tuning is preferably performed according to the tuning priority, it is possible to suitably minimize the operating time and also to suitably secure the excellence of the tuning operating result. Preferably, when the tuning is performed in a specific frequency according to the priority, the tuning work is performed in such a manner that the performance of a specific frequency is suitably maximized while the decrease of the gain of other frequency is suitably minimized by checking the gain of other frequency bandwidth.

According to other certain embodiments of the invention as described herein, in order to minimize the operating time and improve the performance, the method of tuning a glass antenna according to the present invention preferably comprises setting a specific frequency according to the order in which gain values in the specific frequencies are suitably smaller than a desired gain reference value or a specific gain reference value which is a basic gain value for performing an antenna function. For example, as shown in Tables 1 and 2, the tuning is preferably performed according to the priority set by the amount of improved gains in the selected specific frequency.

According to certain preferred embodiments of the invention, the glass antenna using a multi loop and the glass antenna being loaded with a multi line are preferred for the glass antenna tuning method of the invention as described herein, however, the glass antennae as described herein are not intended to be limiting and one skilled in the art understands that the present invention can be applied to all kinds of glass antenna.

Preferably, the present invention has an effect of improving a work efficiency in the mounting tuning by obtaining an optimum direction and magnitude which can suitably enhance a gain through analyzing a change of gain in a specific frequency.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for tuning a glass antenna, the method comprising:

analyzing a sensitivity of structures of a designed glass antenna, on a frequency band including tuning frequencies at which tuning is needed, using a simulation tool, which is a computer-based modeling tool;

determining a priority depending on size of gains improved when the structures of the glass antenna are changed in each tuning frequency using analysis data of the sensitivity;

selecting a specific frequency of the tuning frequencies; and performing a tuning according to the priority using the simulation tool, wherein the tuning is stopped in the specific frequency when a gain value in other frequency is lower than a specific gain reference value which is a gain value for performing an antenna function.

2. The method of claim 1, wherein the specific frequency is selected according to the order in which gain values of the tuning frequencies are smaller than a predetermined gain reference value or specific gain reference value.

3. The method of claim 1, wherein the sensitivity is a gain change obtained by using a simulation program, which is a simulation software of the simulation tool.

4. The method of claim 1, wherein the structure of glass antenna has one or more contact points in which two or more lines are intersect, and the one or more contact points are moved in a right, left, upper or lower direction to perform the tuning.

5. The method of claim 1, wherein the structure of glass antenna has lines, and lengths of the lines are enlarged or reduced for change of the structure of the glass antenna.

6. A method for tuning a glass antenna, the method comprising:

analyzing a sensitivity of structures of a designed glass antenna, on a frequency band including tuning frequencies at which tuning is needed;

determining a priority depending on size of gains improved when the structures of the glass antenna are changed in each tuning frequency using analysis data of the sensitivity;

selecting a specific frequency of the tuning frequencies; and performing a tuning according to the priority using a simulation tool, which is a computer-based modeling tool.

7. The method of claim 6, wherein analyzing the sensitivity is carried out using the simulation tool.

8. The method of claim 6, wherein the tuning is stopped in the specific frequency when a gain value in other frequency is lower than a specific gain reference value which is a gain value for performing an antenna function.

9. The method of claim 6, wherein the specific frequency is selected according to the order in which gain values of the tuning frequencies are smaller than a predetermined gain reference value or specific gain reference value.

10. The method of claim 6, wherein the sensitivity is a gain change obtained by using a simulation program, which is a simulation software of the simulation tool.

11. The method of claim 6, wherein the structure of the glass antenna has one or more contact points in which two or more lines intersect.

12. The method of claim 11, wherein the one or more contact points are moved to perform the tuning.

13. The method of claim 12, wherein the direction is selected from a right, left, upper or lower direction.

14. The method of claim 6, wherein the structure of glass antenna comprises lines.

15. The method of claim 13, wherein the lengths of the lines are enlarged or reduced for change of the structure of the glass antenna.

* * * * *